United States Patent
Lin et al.

(10) Patent No.: US 8,767,178 B2
(45) Date of Patent: Jul. 1, 2014

(54) IMMERSION LITHOGRAPHY SYSTEM USING DIRECTION-CONTROLLING FLUID INLETS

(75) Inventors: Burn Jeng Lin, Hsin-Chu (TW); Ching-Yu Chang, Yilang County (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 97 days.

(21) Appl. No.: 13/482,879

(22) Filed: May 29, 2012

(65) Prior Publication Data
US 2012/0236276 A1    Sep. 20, 2012

Related U.S. Application Data

(63) Continuation of application No. 11/670,860, filed on Feb. 2, 2007, now Pat. No. 8,208,116.

(60) Provisional application No. 60/864,204, filed on Nov. 3, 2006.

(51) Int. Cl.
*G03B 27/42* (2006.01)

(52) U.S. Cl.
USPC .............. 355/53; 355/30; 355/72; 355/77

(58) Field of Classification Search
CPC .................................................. G03F 7/70341
USPC ............................ 355/30, 53, 72, 77
See application file for complete search history.

(56) References Cited

U.S. PATENT DOCUMENTS

| | | | |
|---|---|---|---|
| 5,610,683 | A | 3/1997 | Takahashi |
| 6,788,477 | B2 | 9/2004 | Lin |
| 7,075,616 | B2 | 7/2006 | Derksen et al. |
| 7,091,502 | B2 | 8/2006 | Gau et al. |
| 7,199,858 | B2 | 4/2007 | Lof et al. |
| 7,213,963 | B2 | 5/2007 | Lof et al. |

(Continued)

FOREIGN PATENT DOCUMENTS

| | | |
|---|---|---|
| CN | 1490673 | 4/2004 |
| CN | 1746775 | 3/2006 |

(Continued)

OTHER PUBLICATIONS

Burn Jeng Lin, "Immersion Lithography System Using A Sealed Wafer Bath," U.S. Appl. No. 11/671,046, filed Feb. 5, 2007, 27 pages.

(Continued)

*Primary Examiner* — Steven H Whitesell Gordon
*Assistant Examiner* — Mesfin T Asfaw
(74) *Attorney, Agent, or Firm* — Haynes and Boone, LLP

(57) ABSTRACT

Immersion lithography system and method using direction-controlling fluid inlets are described. According to one embodiment of the present disclosure, an immersion lithography apparatus includes a lens assembly having an imaging lens disposed therein and a wafer stage configured to retain a wafer beneath the lens assembly. The apparatus also includes a plurality of direction-controlling fluid inlets disposed adjacent to the lens assembly, each direction-controlling fluid inlet in the plurality of direction-controlling fluid inlets being configured to direct a flow of fluid beneath the lens assembly and being independently controllable with respect to the other fluid inlets in the plurality of direction-controlling fluid inlets.

17 Claims, 18 Drawing Sheets

(56) References Cited

U.S. PATENT DOCUMENTS

| | | | |
|---|---|---|---|
| 7,304,715 B2 | 12/2007 | Cadee et al. | |
| 7,349,064 B2 | 3/2008 | Nakano | |
| 7,379,162 B2 | 5/2008 | Miyajima | |
| 7,397,533 B2 | 7/2008 | Verhagen et al. | |
| 7,483,119 B2 | 1/2009 | Owa et al. | |
| 7,501,226 B2 | 3/2009 | Lin et al. | |
| 7,932,991 B2 | 4/2011 | Nagasaka et al. | |
| 7,986,395 B2 | 7/2011 | Chang et al. | |
| 8,004,650 B2 | 8/2011 | Hirukawa et al. | |
| 8,035,797 B2 | 10/2011 | Tani et al. | |
| 2004/0263809 A1* | 12/2004 | Nakano | 355/30 |
| 2005/0018155 A1* | 1/2005 | Cox et al. | 355/30 |
| 2005/0219488 A1 | 10/2005 | Nei et al. | |
| 2006/0023183 A1* | 2/2006 | Novak et al. | 355/53 |
| 2006/0119809 A1* | 6/2006 | Verhagen et al. | 355/30 |
| 2007/0177125 A1 | 8/2007 | Shibazaki | |
| 2008/0106710 A1 | 5/2008 | Lin et al. | |
| 2008/0106715 A1 | 5/2008 | Lin et al. | |

FOREIGN PATENT DOCUMENTS

| | | |
|---|---|---|
| CN | 1501172 | 6/2006 |
| JP | 06124873 | 5/1994 |
| JP | 2005166776 | 6/2005 |
| JP | 2005-191557 | 7/2005 |
| JP | 2006-165562 | 6/2006 |
| JP | 2006-190996 | 7/2006 |
| WO | WO 2005/024517 | 3/2005 |

OTHER PUBLICATIONS

Chinese Patent Office, Office Action dated Feb. 20, 2009, Application No. 2007101531915, 8 pages.

Ching-Yu Chang, "Apparatus and Method for Immersion Lithography," U.S. Appl. No. 11/760,365, filed Jun. 8, 2007, 22 pages.

Dutch Patent Office, Written Opinion and Search Report dated Dec. 2, 2009, Application No. 1034412, 7 pages.

Japanese Patent Office, Final Notice of Reasons for Refusal dated Jan. 4, 2011, Application No. 2007-245245, 5 pages.

Japanese Patent Office, Office Action issued Jun. 28, 2010, Application No. 2007-198042, 6 pages.

Dutch Patent Office, Written Opinion and Search Report on Patent Application No. 1034411 issued Dec. 2, 2009, 8 pages.

\* cited by examiner

IMMERSION LITHOGRAPHY SYSTEM USING DIRECTION-CONTROLLING FLUID INLETS

CROSS-REFERENCE

This application is a continuation of U.S. patent application Ser. No. 11/670,860, filed on Feb. 2, 2007, which claims priority from U.S. Provisional Patent Application Ser. No. 60/864,204, filed on Nov. 3, 2006, both of which are-hereby incorporated by reference in their-entirety.

BACKGROUND

The present disclosure relates generally to immersion photolithography and, more particularly, to an immersion photolithography system using a sealed wafer bottom.

Immersion lithography is a relatively new advancement in photolithography, in which the exposure procedure is performed with a liquid filling the space between the surface of the wafer and the lens. Using immersion photolithography, higher numerical apertures can be built than when using lenses in air, resulting in improved resolution. Further, immersion provides enhanced depth-of-focus (DOF) for printing ever smaller features. It is understood that the present disclosure is not limited to immersion lithography, but immersion lithography provides an example of a semiconductor process that can benefit from the invention described in greater detail below.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to the liquid immersion photolithography systems, and, more particularly, to an immersion photolithography system using a sealed wafer bottom. It is understood, however, that specific embodiments are provided as examples to teach the broader inventive concept, and one of ordinary skill in the art can easily apply the teachings of the present disclosure to other methods and systems. Also, it is understood that the methods and systems discussed in the present disclosure include some conventional structures and/or steps. Since these structures and steps are well known in the art, they will only be discussed in a general level of detail. Furthermore, reference numbers are repeated throughout the drawings for the sake of convenience and example, and such repetition does not indicate any required combination of features or steps throughout the drawings.

Generally, there are two system configurations in immersion lithography, including lens-based ("LBC") systems and wafer-based ("WBC") systems. With LBC systems, immersion fluid is selectively applied to and extracted from a small region between the lens and the wafer and the immersion assembly is stationary with respect to the lens as the wafer is stepped or scanned.

Figure 1A:
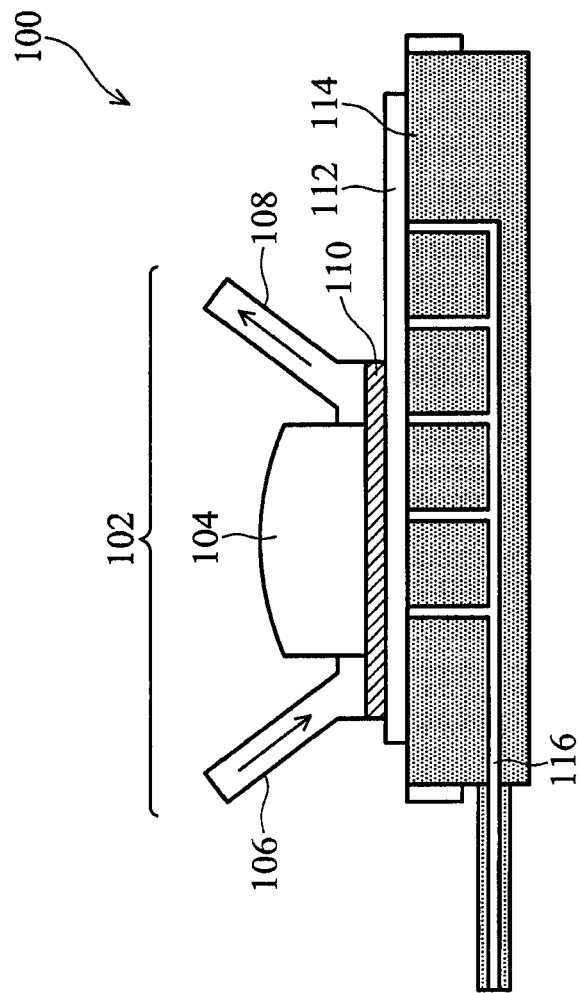
FIG. 1A illustrates an LBC immersion system.

Referring to FIG. 1A, one embodiment of an LBC system 100 includes an immersion head 102 comprising an imaging lens 104, a fluid inlet 106, and a fluid outlet 108. As shown in FIG. 1A, immersion fluid is disposed in an area 110 beneath the imaging lens 104 and above a wafer 112, which is secured to a wafer stage 114 via a vacuum system 116. The fluid is injected into the area 110 via the fluid inlet 106 and expelled via the fluid outlet 108, which process may result in fluid temperature control issues and fluid evaporation problems.

Advantages to LBC systems include the fact that the wafer stage thereof is essentially identical to that of a dry system, thereby saving development time and expense. Additionally, with LBC systems it is possible to maintain the same alignment, focus, and leveling setup as used in dry systems. Finally, with LBC systems, the volume of immersion fluid used is small, so that filling up the fluid-retaining cavity can be performed very quickly, thereby maintaining high wafer throughput volume.

Figure 1B:
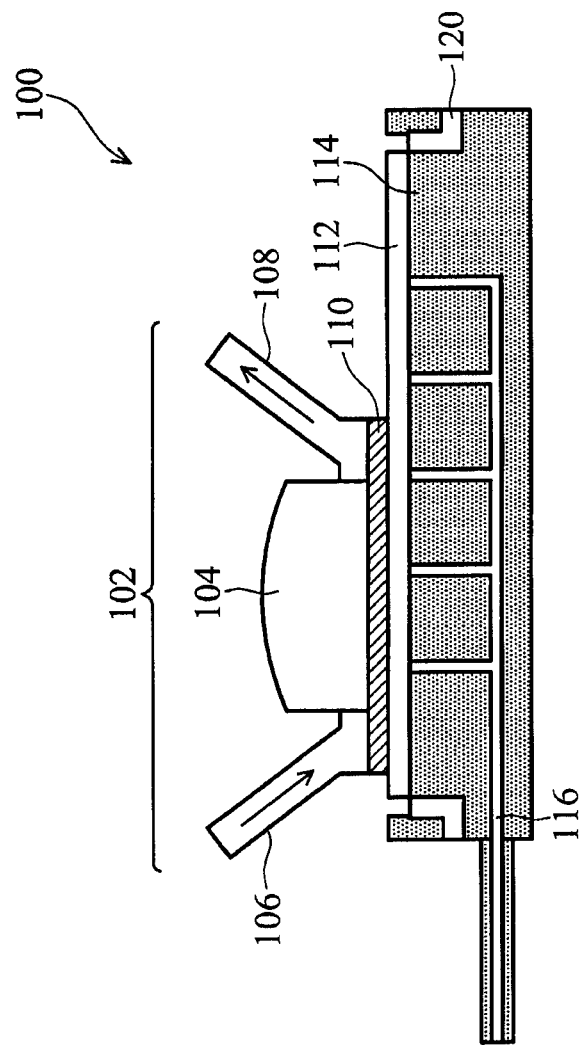
FIG. 1B illustrates an alternative design of an LBC immersion system.

Problems associated with LBC systems include the fact that, near the edge of the wafer, the immersion region includes the wafer and areas outside the chuck, such that maintaining the hydrodynamics in the fluid cavity and managing fluid extracting can be more difficult. Another problem is that particles at the backside of the wafer tend to be washed to the surface. Additionally, the LBC immersion head tends to leave trace amounts of fluid behind on the wafer surface as the wafer moves during the step-and-scan operation. This is a root cause of fluid stains on the wafer. Yet another problem associated with LBC systems is that the photoresist will have inconsistent fluid-contact history at different locations. Specifically, as the wafer is stepped from field to field, the neighboring fields, or parts thereof, are covered by fluid. This may occur to the same field multiple times and not necessarily in the same sequence or the same number of times for each field. Finally, in some LBC system designs, such as illustrated in FIG. 1B, immersion fluid flows over the wafer edge into a fluid drain 120 located along the edge of the wafer 112. While this reduces particle trapping, it results in wafer cooling at the edge, distorting the wafer and affecting overlay accuracy.

Figure 2:
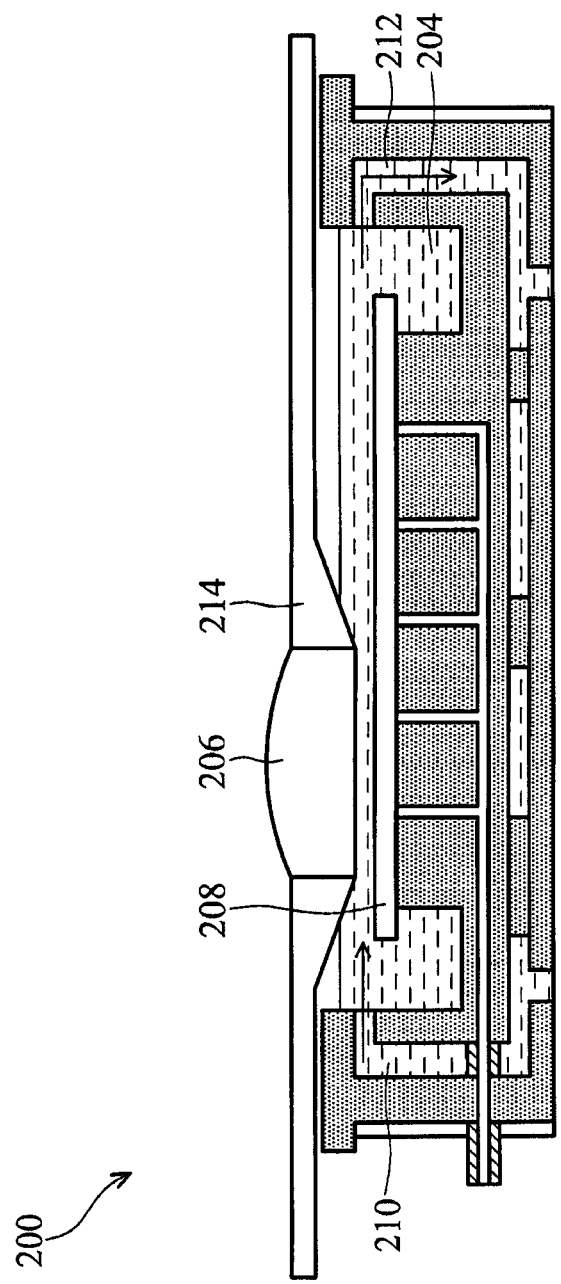
FIG. 2 illustrates a WBC immersion system.

Referring to FIG. 2, in contrast to LBC systems, in WBC systems, the wafer is completely immersed in immersion fluid in a circulating tank in the wafer stage. In a WBC system 200, immersion fluid is selectively introduced into and expelled from a small region 204 between a lens 206 and a wafer 208 via a fluid inlet 210 and a fluid outlet 212, respectively. The immersion fluid circulates in the region 204 under and over the wafer stage continuously and is filtered and temperature-regulated as it moves across the surface area of the wafer 208. The fluid can be completely drained from the region 204 to allow for loading and unloading of the wafer 208. A cover 214 prevents immersion fluid 202 from spilling over and foreign particles from falling into the fluid.

Advantages of WBC systems include the fact that exposure at the edge of the wafer is the same as that at the center thereof. Moreover, each field contacts the wafer for the same amount of time. Additionally, there is no possibility of fluid stains caused by an immersion head and there is no issue of bubble generation from poor hydrodynamics near the edge of the wafer. WBC systems do, however, suffer certain deficiencies, including the fact that pre- and post-exposure soaking times of each exposure field are different. Moreover, it takes more effort or more time to fill and drain the immersion fluid and focusing, tilting, and alignment have to be performed in the immersion mode if twin stage is not used. Finally, substantial redesign of the wafer stage, as compared to a dry system, is necessary.

Two additional problems affect both LBC and WBC systems. These include the fact that the resist at the wafer edge within several millimeters (the "edge bead"), is usually removed because it is thicker than the rest of the resist coating. This leaves the possibility of broken resist fragments under the flushing of the fluid, thus contributing to particulate defects. Moreover, the fluid can seep into the underside of the wafer, making it a contamination source and susceptible for contamination as well. The evaporation of this fluid can contribute to uneven cooling and overlay errors.

Figure 3:
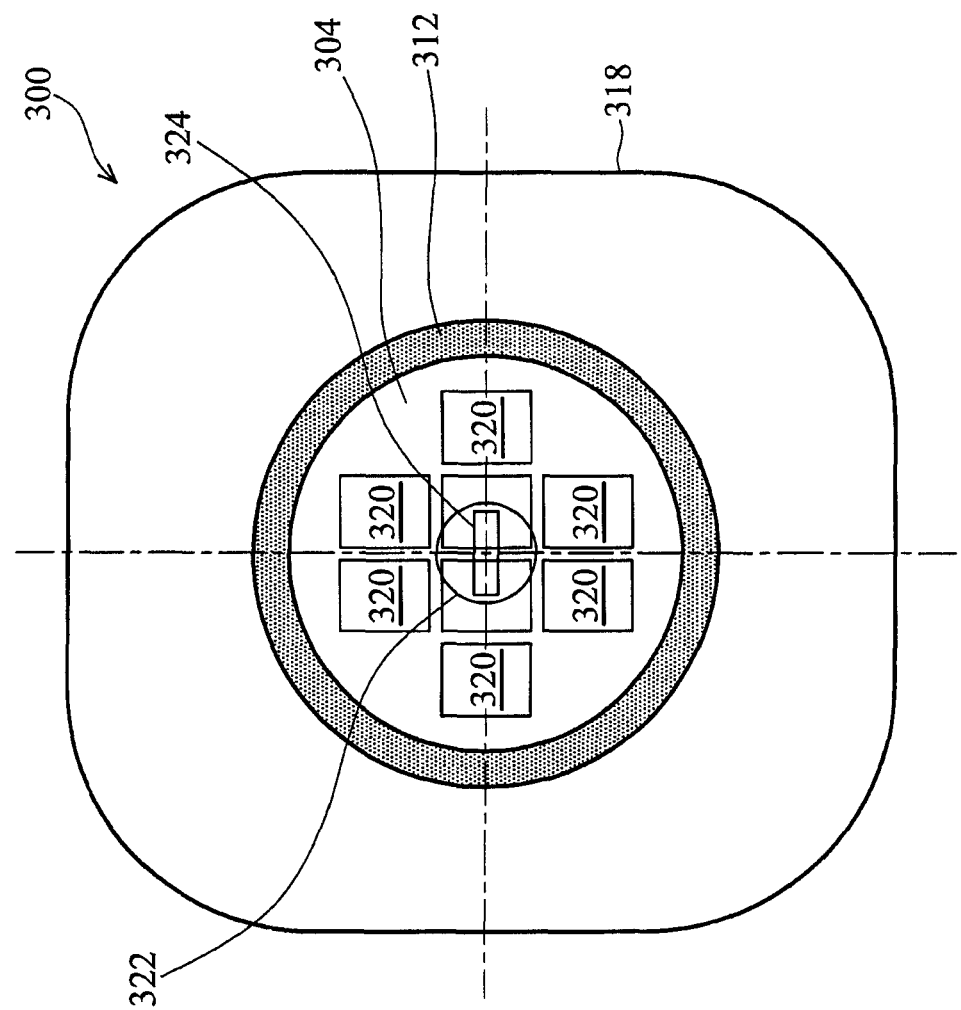
FIG. 3 illustrates a top view of a full immersion lithography system wherein a seal ring is disposed in contact with a bottom edge of a wafer in accordance with one embodiment.
Figure 4:
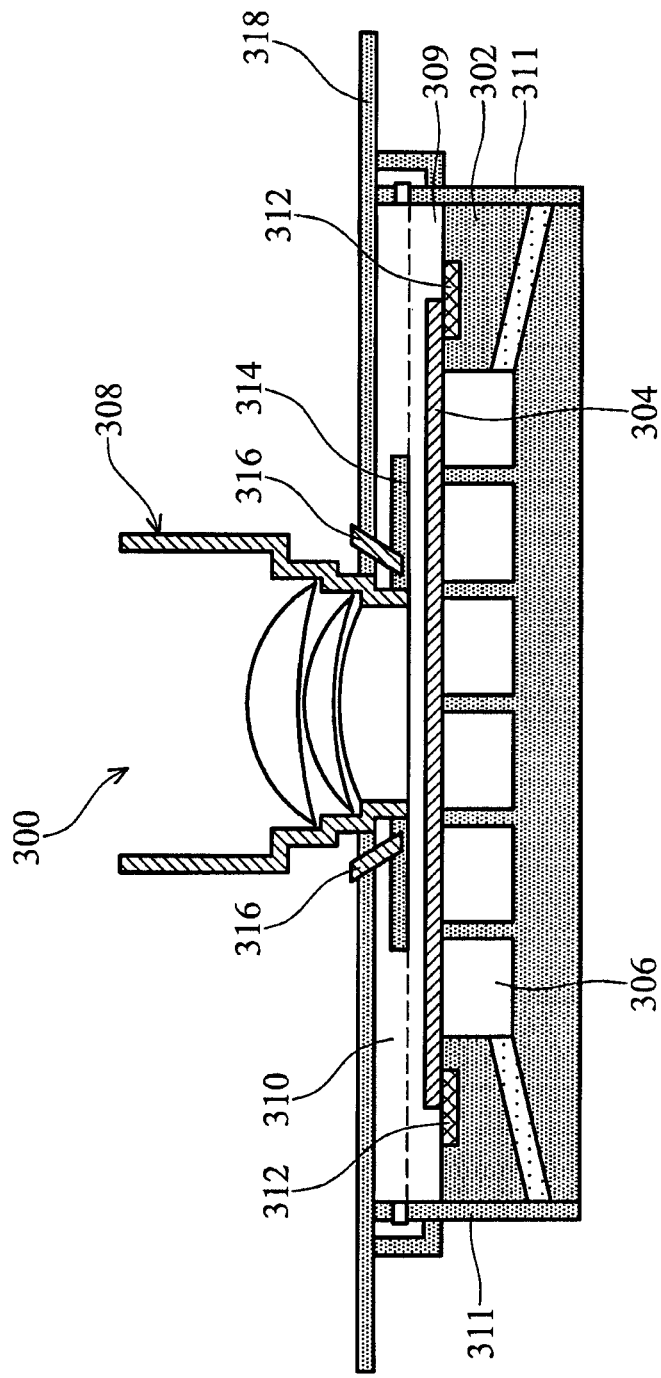
FIG. 4 illustrates a side view of the full immersion lithography system of FIG. 3.

Referring now to FIGS. 3 and 4, illustrated therein are top and side views of a full immersion lithography system 300 in which a seal ring is disposed such that it is in contact with a bottom edge of a wafer in accordance with one embodiment. Such a full immersion lithography system may alternatively be referred to herein as a "WISBOT" system. As best shown in FIG. 4, the system 300 comprises a wafer stage 302 to which a wafer 304 may be secured via a vacuum system 306. A lens assembly 308 is disposed over the wafer 304. In accordance with one embodiment, immersion fluid 309 is disposed in an area, or tank, 310 over and around the wafer 304 between the wafer and the lens assembly 308. The immersion fluid is retained within the tank 310 by a fluid retaining wall 311. In one embodiment, the refractive index of the immersion fluid is substantially 1.34. A seal ring 312 constructed of rubber or similar material is disposed on the wafer stage 302 such that it contacts a bottom edge of the wafer 304 disposed on the stage. In one embodiment, the thickness of the seal ring 312 is between 1 and 10 millimeters. The top edge of the seal ring 312 extends slightly above the bottom of the wafer 304 so that when the wafer is secured to the wafer stage 302 by the vacuum system 306, the edge of the wafer is sealed against fluid seepage by the seal ring. In other words, the seal ring 312 seals what might otherwise be a gap between the wafer 304 and the wafer stage 302.

A proximity cover 314 having a plurality of fluid inlets 316 therethrough is provided for confining the immersion fluid to the area 310 and for maintaining the temperature of the immersion fluid. The fluid inlets 316 are provided for regulating the fluid flow, as will be described in greater detail herein below. The proximity cover 314 is of a size appropriate for keeping the fluid homogeneous between the lens and the wafer. In the present embodiment, it is not too large to unnecessarily enlarge the size of the enclosing cover, because it should not move too close to the fluid retaining wall 311. An enclosing cover 318 is attached to a lens column of the lens assembly 308 to enclose the tank 310 and create and maintain a fluid-vapor-rich environment therein.

FIG. 3 best illustrates the relationship between the seal ring 312, the wafer 304, and the enclosing cover 318. As shown in FIG. 3, the wafer 304 comprises a plurality of scanned fields 320. A region 322 represents a lens field of the lens assembly 308. As also best illustrated in FIG. 3, the lens contains a cover 322 comprising a slot 324 that dictates the scanning exposure field.

Figure 5:
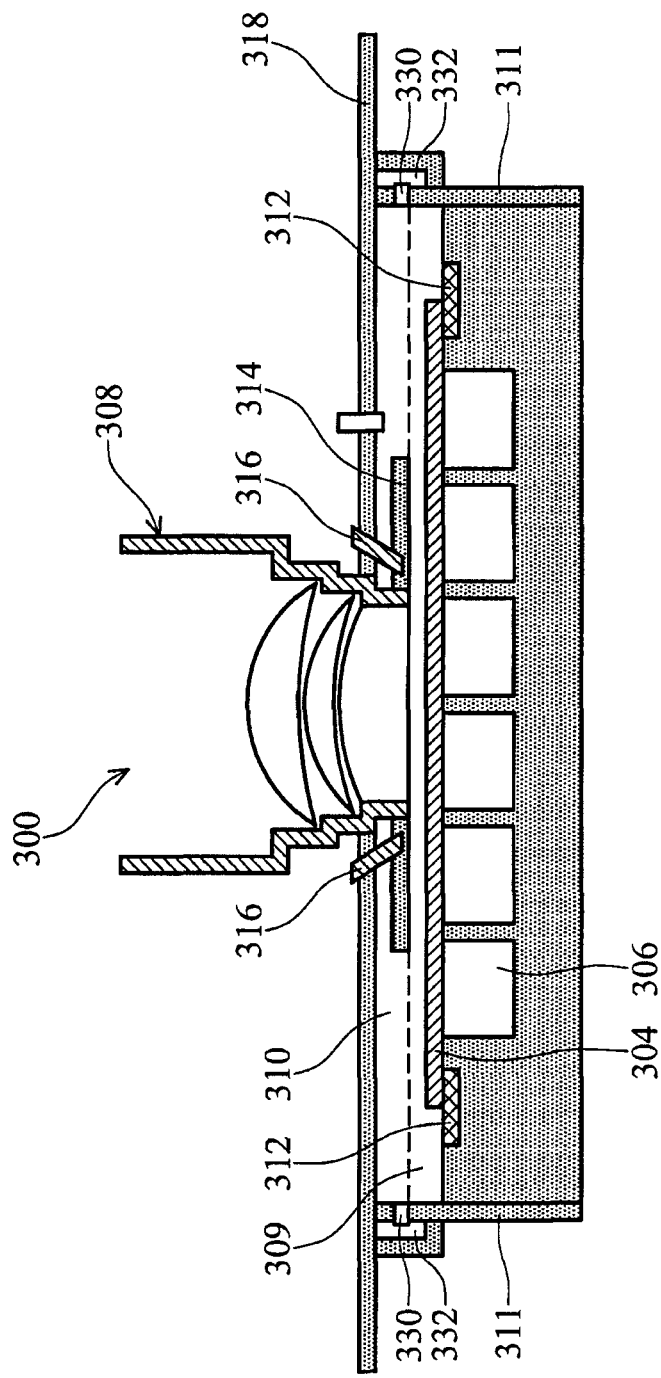
FIG. 5 is an enlarged side view of the full immersion lithography system of FIG. 3.

As best shown in FIG. 5, which is an enlarged and enhanced view of the system 300, vapor of the immersion fluid 309 is confined within the area 310, which is bounded by the enclosing cover 318, the fluid retaining wall 311 and the wafer stage 302 with the wafer 304 pressed against the seal ring 312 by the vacuum system 306. After a high concentration of fluid vapor has been achieved in a gap above the fluid 309 within the area 310, sufficient immersion fluid is introduced to cover the entire surface of the wafer 304. Overflow holes 330 allow excess fluid to flow into a fluid collection trench 332. The fluid vapor inevitably escapes through a gap between the fluid retaining wall 311 and the enclosing cover 318 and must be replenished periodically. This gap is necessary to ensure free movement between the fluid retaining wall 311 and the enclosing cover 318 and is kept small and uniform to keep fluid vapor loss to a minimum.

Figure 6:
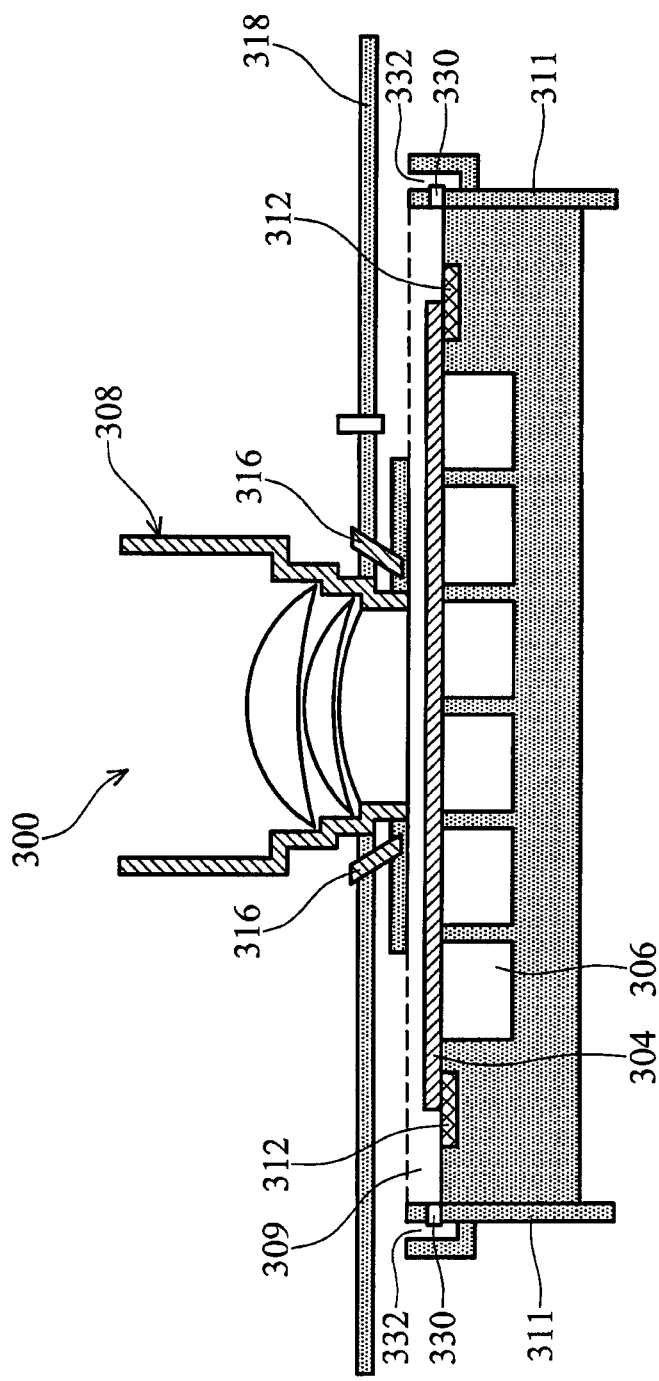
FIG. 6 illustrates the full immersion lithography system of FIG. 3 after the retaining wall thereof has been lowered to drain the immersion fluid therefrom.
Figure 7:
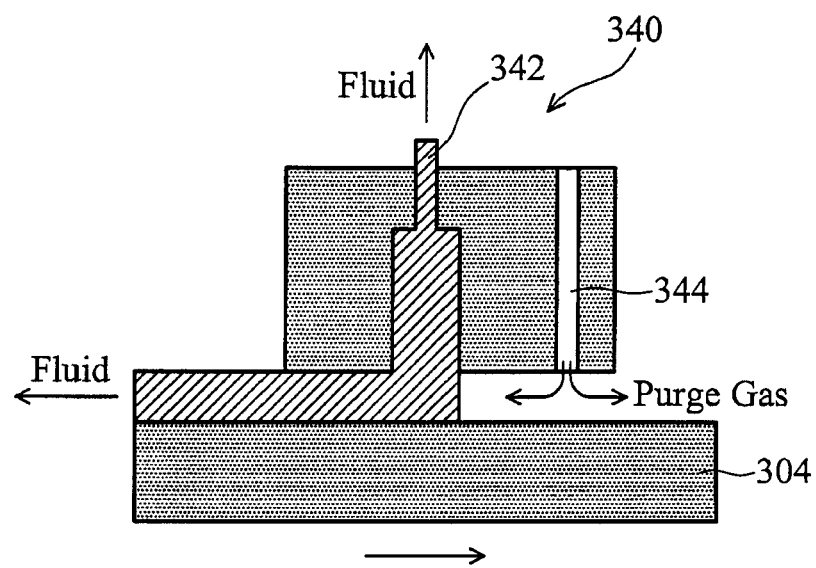
FIG. 7 illustrates a drying head for use in removing residual fluid from a wafer.

FIG. 6 illustrates the system 300 after the fluid retaining wall 311 has been lowered to empty the area 310 of fluid. After the wafer 304 and wafer stage 302 are removed from beneath the lens assembly 308, residual fluid and wetness on the wafer 304 may be removed using a drying head comprising an air knife such as that illustrated in FIG. 7 and designated by a reference numeral 340. The drying head 340 comprises at least one vacuum outlet 342 for draining immersion fluid and at least one air purge inlet 344 to purge gas for drying. Additional details regarding the drying head 304 and alternative embodiments thereof are provided in related U.S. Patent Application Ser. No. 60/864,241 entitled "IMMERSION LITHOGRAPHY SYSTEM USING A SEALED WAFER BATH", which is hereby incorporated by reference in its entirety.

Figure 8A:
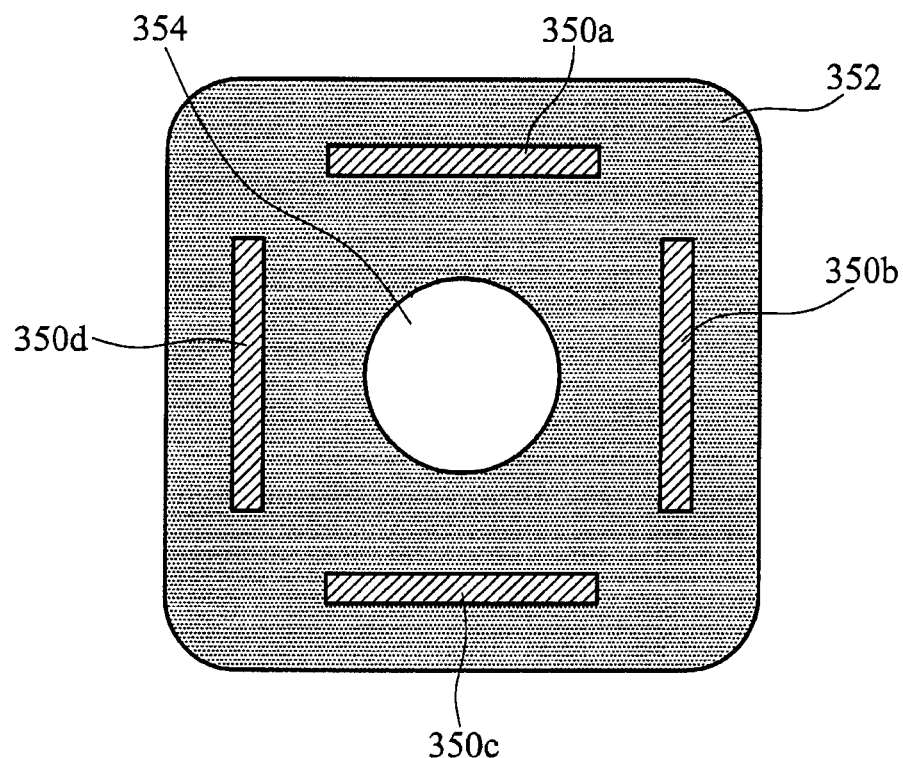
FIGS. 8A and 8B illustrate one implementation of a proximity cover including direction-controlling fluid inlets.
Figure 8B:
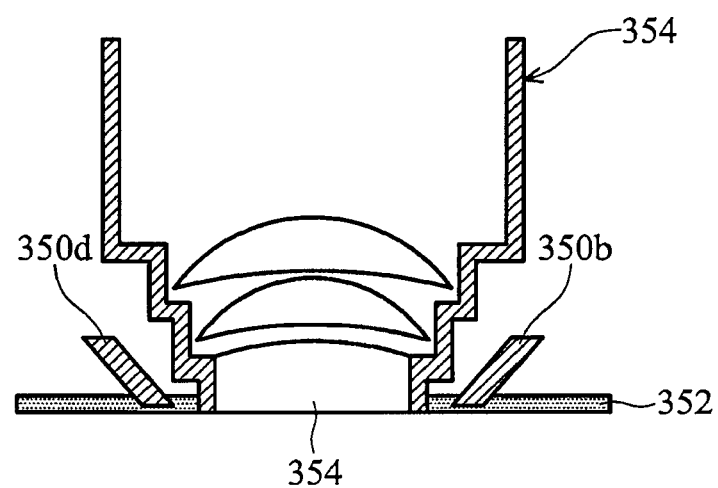

FIGS. 8A-12B illustrate regulation of fluid flow via fluid inlets, such as the fluid inlets 316. FIGS. 8A and 8B illustrate one implementation of the use of direction-controlling fluid inlets 350a-350d disposed in a proximity cover 352. As shown in FIGS. 8A and 8B, the four inlets 350a-350d surround a lens assembly 354 at angles in 90 degree increments. Each of the inlets 350a-350d directs fluid toward the lens assembly 354 and the inlet opposite it. In particular, the inlet opposite the edge of the proximity cover 354 that is closest to the edge of the wafer (not shown in FIGS. 8A and 8B) at a given time is opened to allow for flow of fluid. All of the other inlets are closed via a fluid control valve disposed therein. In this manner, fresh and uniformly flowing fluid always flows under the lens assembly 354 to ensure freedom from particles and a homogenous immersion medium for aberration-free imaging. Any particle near the edge of the wafer is always carried by the fluid to be drained out. Referring again to FIG. 5, it is important that the temperature of the fluid 309 is strictly controlled to constitute an isothermal environment in the imaging area that comprises the lens assembly 308, the enclosing cover 318, the proximity cover 314, the immersion fluid, the fluid vapor, the fluid retaining wall 311 the wafer 304, and the wafer stage 302. Needless to say, the temperature of the incoming fluid vapor must also be controlled to the same degree of accuracy.

Figure 9:
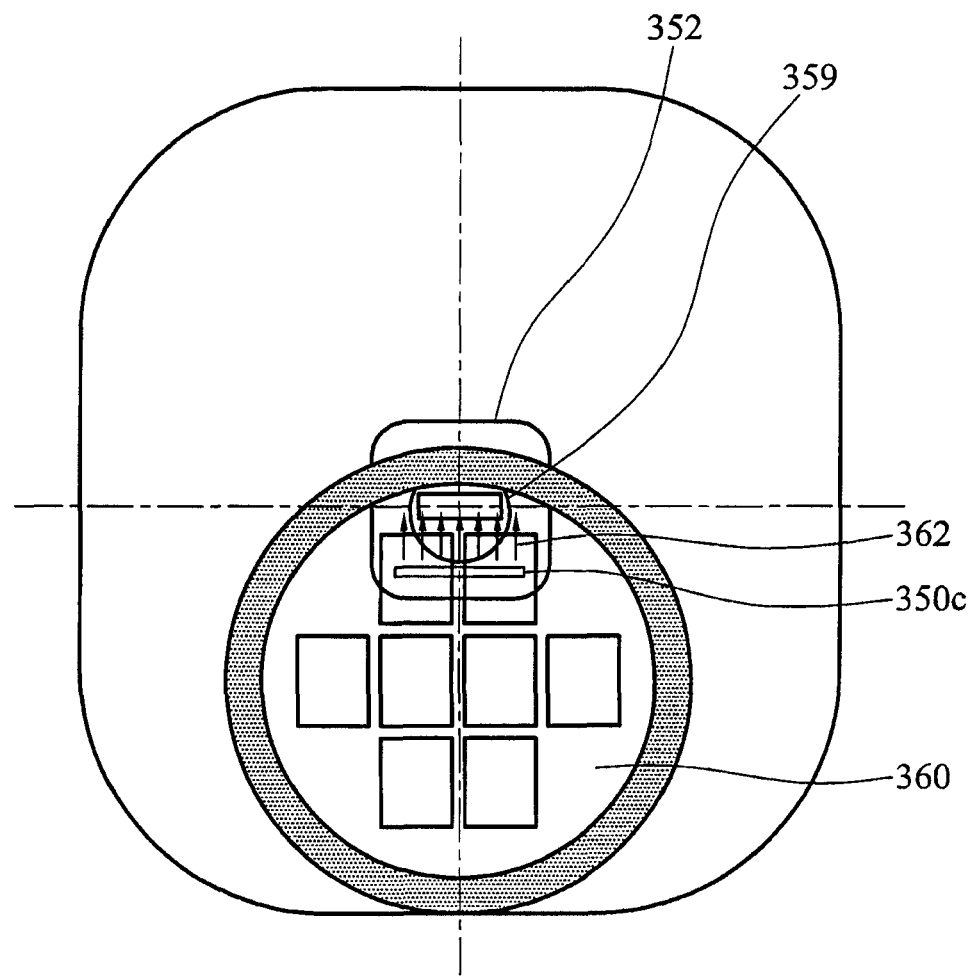
FIGS. 9-11 illustrate fluid direction control implemented using the direction-controlling fluid inlets of FIGS. 8A and 8B.
Figure 10:
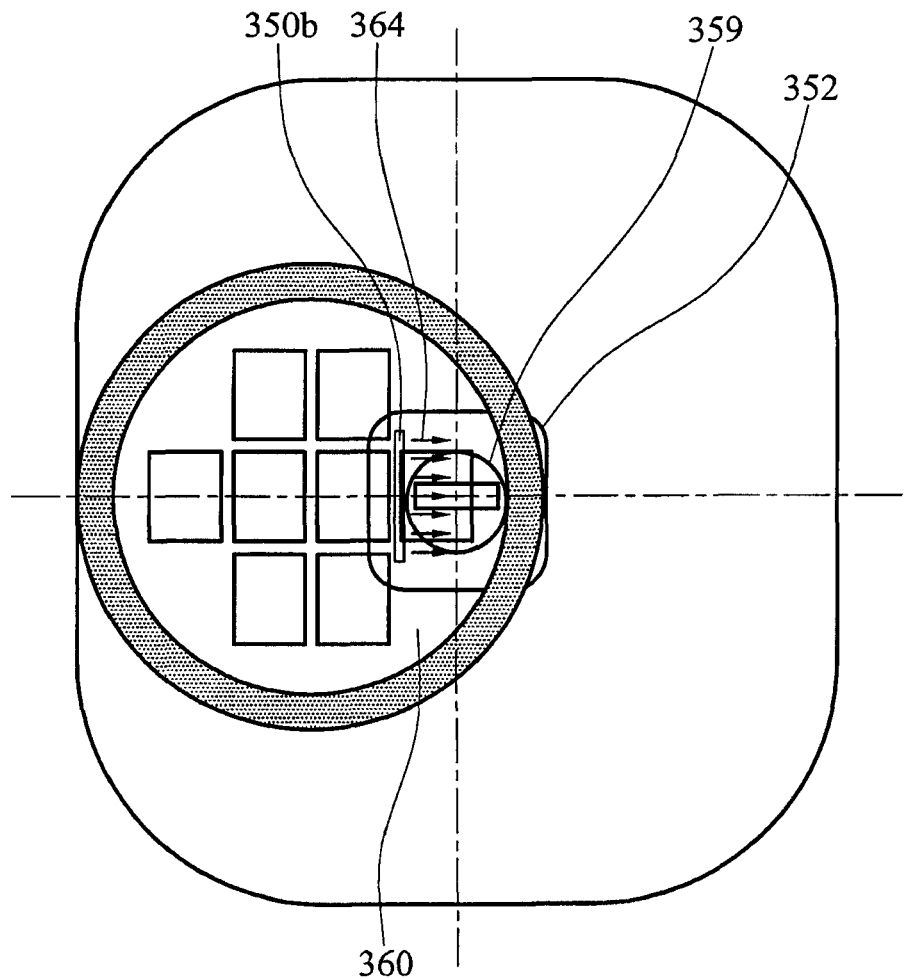
Figure 11:
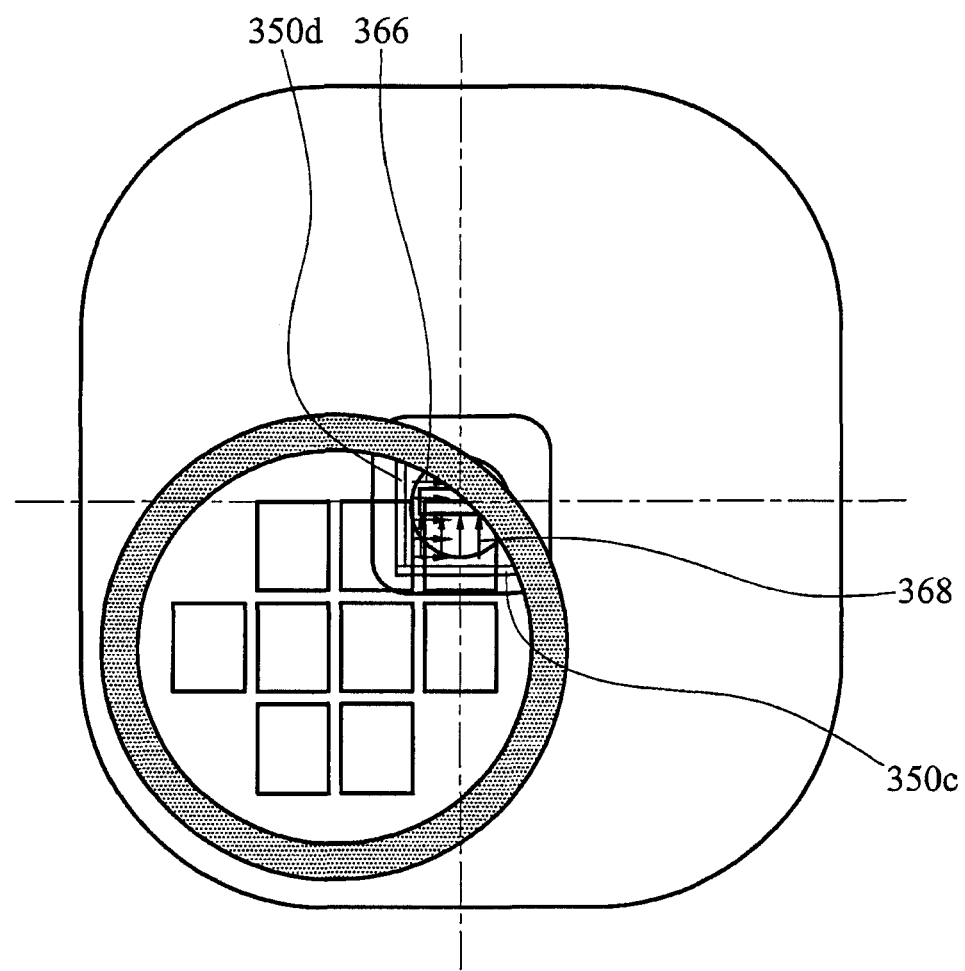

FIG. 9 illustrates a situation in which the inlet 350c, which is the one of the inlets 350a-350d opposite the edge of the proximity cover 354 that is closest to the edge of a wafer 360, is open, while the other inlets 350a, 350b, and 350d, are closed, so that the flow of immersion fluid is directed in a direction indicated by an arrow 362. The fluid passes underneath the lens assembly 354 and flows out through the edge of the wafer 360 nearest the lens assembly. FIG. 10 illustrates a case in which the inlet 350b, which is the one of the inlets 350a-350d opposite the edge of the proximity cover 354 that is closest to the edge of the wafer 360, is open, while the other inlets 350a, 350c, and 350d, are closed, so that the flow of immersion fluid is directed in a direction indicated by an arrow 364. Once again, the fluid passes beneath the lens assembly 354 and flows out through an edge of the wafer 360 nearest the lens assembly. FIG. 11 illustrates a situation in which multiple inlets, in this case, inlets 350b and 350c, are opened to create oblique flow in directions indicated by arrows 366 and 368. Additionally, the flow rate of the inlets 350b, 350c, in the illustrated case, may be differently adjusted to produce an arbitrarily oblique flow direction.

Figure 12A:
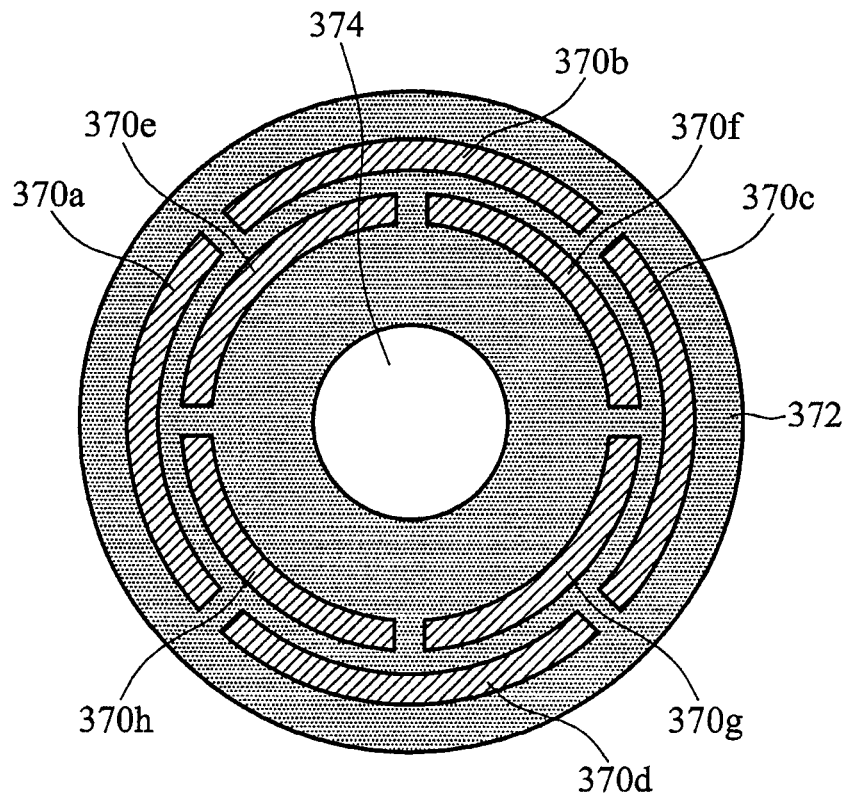
FIGS. 12A and 12B illustrate an alternative implementation of a proximity cover including direction-controlling fluid inlets.
Figure 12B:
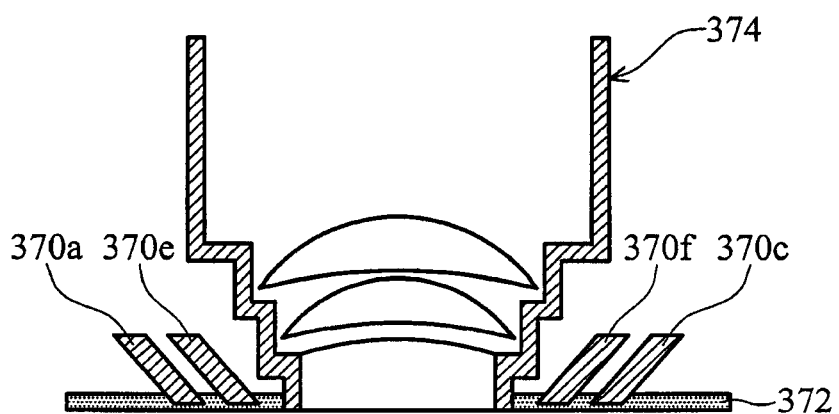

FIGS. 12A and 12B illustrate an alternative implementation of direction-controlling fluid inlets that may be employed in a WISBOT system. As best shown in FIG. 12A, inlets 370a-370h disposed in a proximity cover 372 comprise arcs, rather than lines, and they are arranged in two circular formations, with inlets 370a-370d forming an outer circle and inlets 370e-370h forming an inner circle around a lens assembly 374. This arrangement enables greater flexibility in controlling the flow of fluid by facilitating fluid flows in 45 degree, as opposed to 90 degree, increments.

Figure 13:
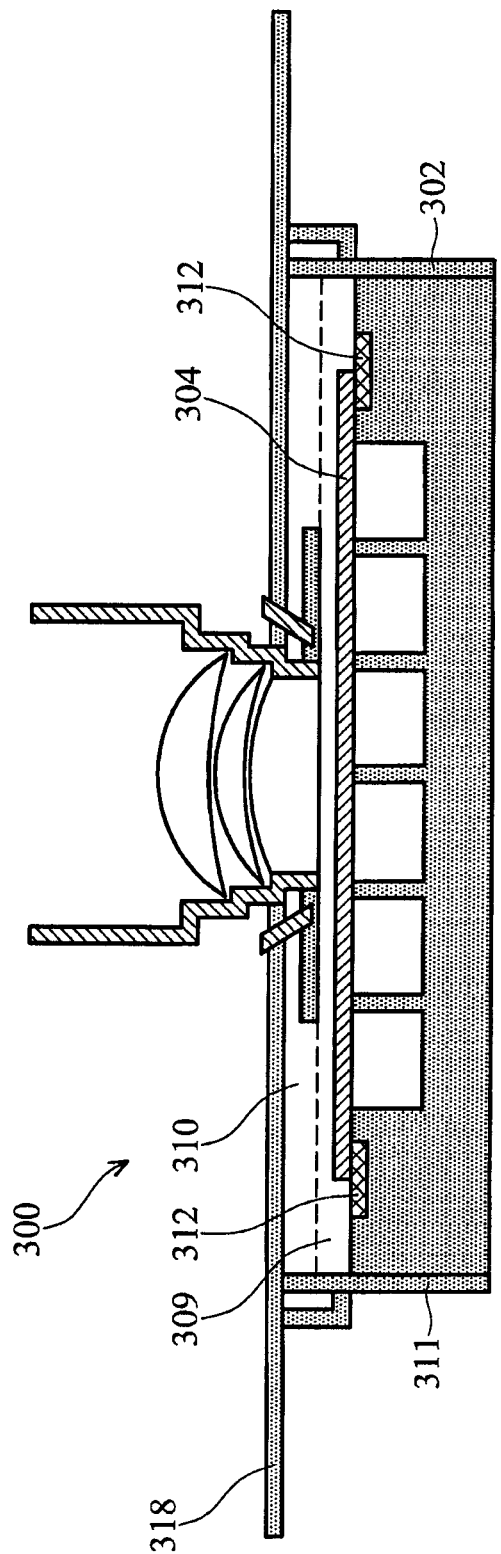
FIG. 13 illustrates an alternative arrangement of the full immersion lithography system of FIG. 3.
Figure 14:
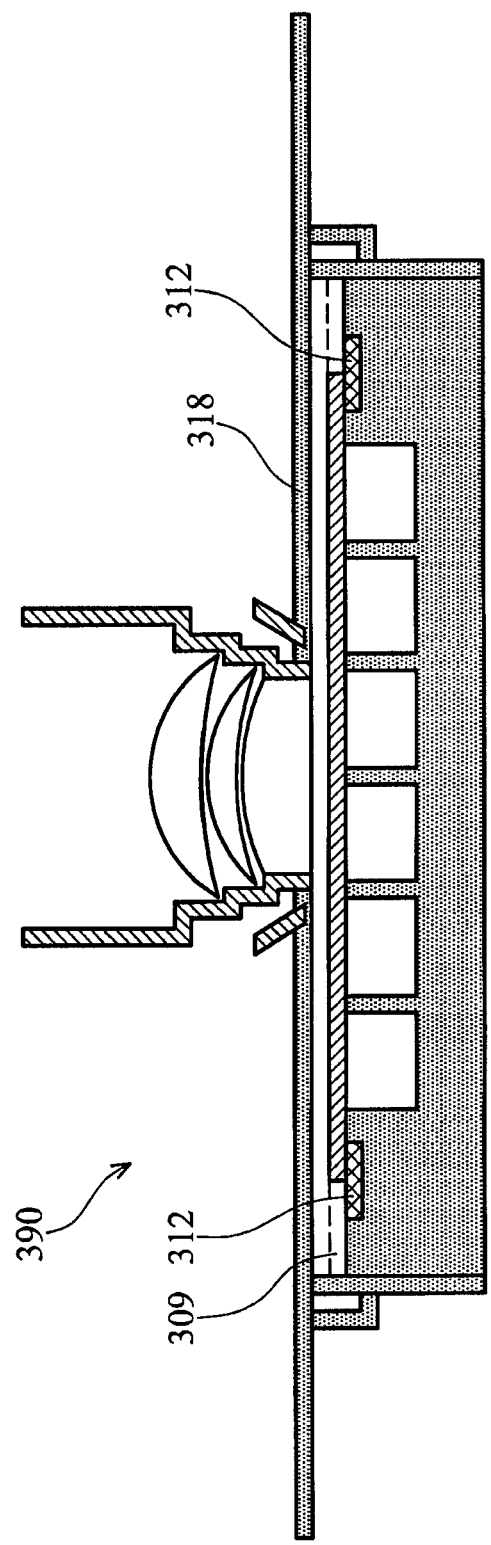
FIG. 14 illustrates a full immersion lithography system in accordance with another alternative embodiment.
Figure 15:
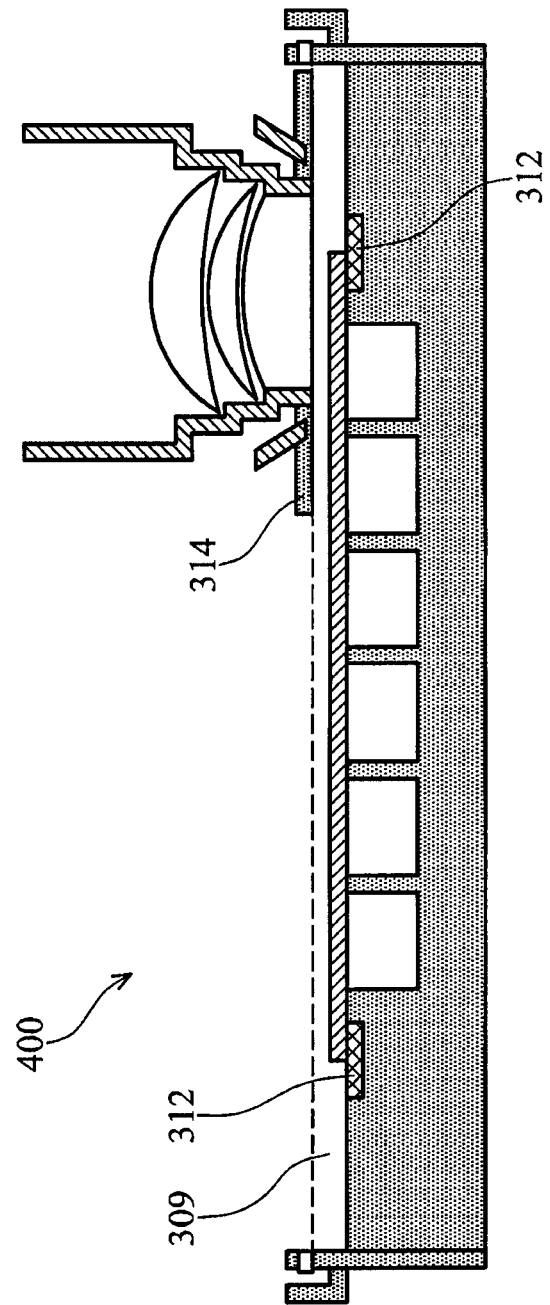
FIG. 15 illustrates a full immersion lithography system in accordance with yet another alternative embodiment.

FIG. 13 illustrates the system 300 of FIG. 5 in which the area 310 has been filled with fluid 309, thereby eliminating the fluid-vapor-rich space above the fluid. In the example illustrated in FIG. 13, the entirety of the area enclosed by the enclosing cover 318, the fluid retaining wall 311, and the wafer stage 302 with the wafer 304 secured thereto is filled with immersion fluid 309. A vapor saturated environment is not necessary to prevent evaporation. FIG. 14 illustrates a WISBOT system 390 that differs from the system 300 in that it does not include a proximity cover; instead, fluid-direction control functions are performed through the enclosing cover 318. FIG. 15 illustrates a WISBOT system 400 that differs from the system 300 in that it does not include an enclosing cover; rather, stringent fluid temperature control is imposed within the proximity cover 314.

Figure 16A:
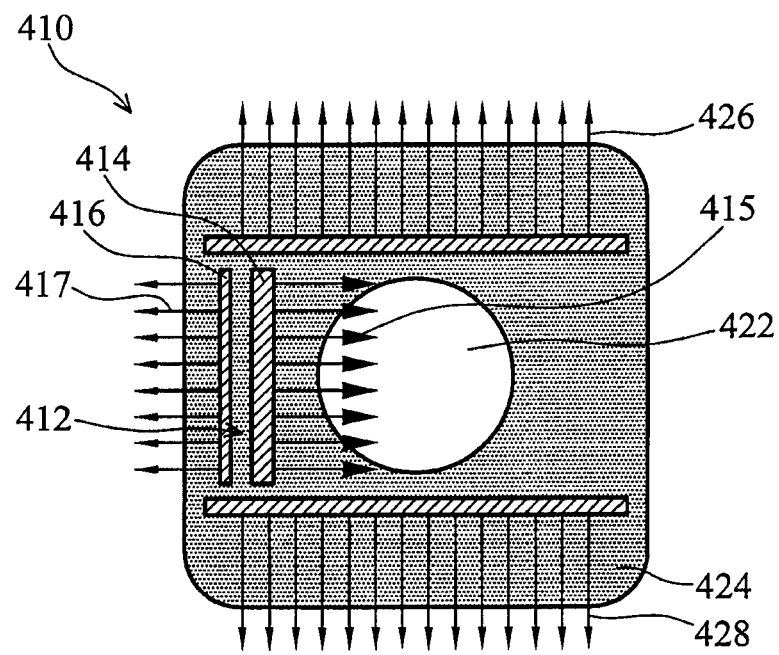
FIGS. 16A and 16B illustrate a double-nozzle direction-controlling fluid inlet arrangement.
Figure 16B:
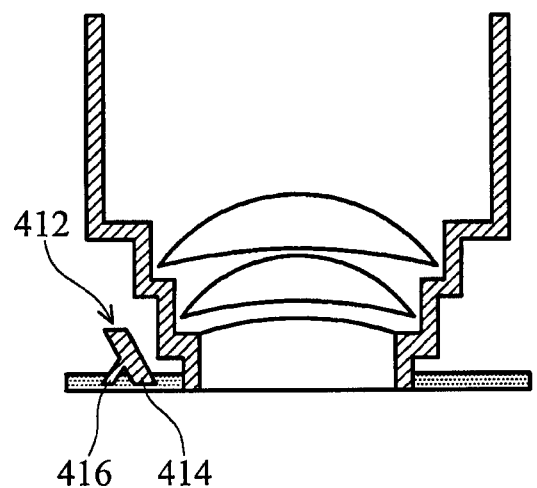
Figure 17:
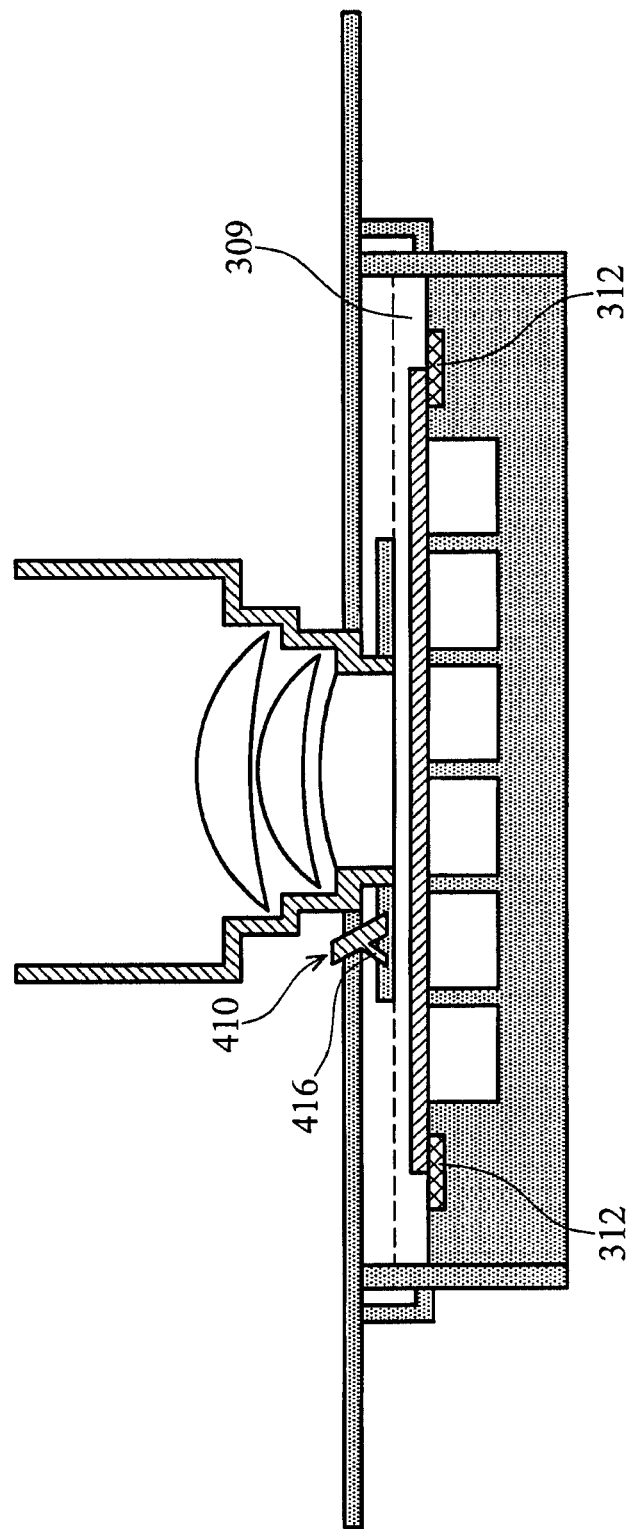
FIG. 17 illustrates the double-nozzle direction-controlling fluid inlet arrangement of FIG. 16 disposed on the full immersion lithography system of FIG. 13.

FIGS. 16A and 16B illustrate a double-nozzle direction-controlling fluid inlet arrangement 410. As shown in FIGS. 16A and 16B, the arrangement 410 includes a double-nozzle inlet 412 includes a main nozzle 414 for directing fluid in a direction indicated by an arrow 415 and a secondary nozzle 416 for directing fluid in a direction opposite that of the main nozzle, as indicated by an arrow 417. In this manner, fresh fluid always flows from the fluid inlet toward the edges of the wafer (not shown). Fluid flow from the main nozzle 414 passes under a lens 418 to maintain a clean and homogenous medium thereunder. Fluid flow from the secondary nozzle 416 is directed toward the opposite side of the wafer. Two additional nozzles 422, 424, arranged to direct fluid in directions indicated by arrows 426 and 428, respectively, toward the respective outside edges of the wafer change the direction of the fluid flow at different relative wafer/lens positions. FIG. 17 illustrates the double-nozzle direction-controlling fluid inlet arrangement 410 of FIG. 16 implemented on the WISBOT system of FIG. 13. The double-nozzle direction-controlling fluid inlet 416 of FIG. 16 can also be implemented on WISBOT systems such as those illustrated in FIGS. 5, 14, and 15.

Although only a few exemplary embodiments of this invention have been described in detail above, those skilled in the art will readily appreciate that many modifications are possible in the exemplary embodiments without materially departing from the novel teachings and advantages of this invention.

It is understood that various different combinations of the above-listed embodiments and steps can be used in various sequences or in parallel, and there is no particular step that is critical or required. Furthermore, features illustrated and discussed above with respect to some embodiments can be combined with features illustrated and discussed above with respect to other embodiments. Accordingly, all such modifications are intended to be included within the scope of this invention.

What is claimed is:

1. An immersion lithography apparatus, comprising:
a lens assembly having an imaging lens disposed therein;
a proximity cover extending outwardly from the lens assembly and configured to confine immersion fluid beneath the lens assembly;
a wafer stage configured to retain a wafer beneath the lens assembly;
a plurality of direction-controlling fluid inlets disposed adjacent to the lens assembly, each direction-controlling fluid inlet in the plurality of direction-controlling fluid inlets being configured to direct a flow of fluid beneath the lens assembly and being independently controllable with respect to the other fluid inlets in the plurality of direction-controlling fluid inlets;
a fluid tank configured to retain the immersion fluid, the fluid tank situated with respect to the wafer stage for enabling immersion of the wafer retained on the wafer stage in the immersion fluid, wherein incoming fluid from the plurality direction-controlling fluid inlets flows into the fluid tank; and
an enclosing cover disposed above and spaced from the proximity cover, the enclosing cover extending over the fluid tank in a manner parallel to the proximity cover to provide a temperature-controlled, non-evaporating environment within the fluid tank; and
wherein the plurality of direction-controlling fluid inlets extend through the both the enclosing cover and the proximity cover.

2. The immersion lithography apparatus of claim 1, further including a fluid control valve operable to independently open and close each direction-controlling fluid inlet in the plurality of direction-controlling fluid inlets.

3. The immersion lithography apparatus of claim 2, wherein the fluid control valve is further operable to open one of the plurality of direction-controlling fluid inlets that is opposite an edge of the wafer that is closest to the imaging lens and close a remainder of the plurality of direction-controlling fluid inlets.

4. The immersion lithography apparatus of claim 2, wherein the fluid control valve is further operable to open two perpendicular direction-controlling fluid inlets of the plurality of direction-controlling fluid inlets to create an oblique flow of fluid.

5. The immersion lithography apparatus of claim 1, wherein incoming fluid has a temperature that is controlled to constitute an isothermal environment in the fluid tank.

6. The immersion lithography apparatus of claim 1, wherein each direction-controlling fluid inlet in the plurality of direction-controlling fluid inlets has an elongated shape with a length that is at least equal to a width of the lens assembly such each fluid inlet is operable to direct fluid beneath the entire width of the lens assembly.

7. The immersion lithography apparatus of claim 1, wherein each direction-controlling fluid inlet in the plurality of direction-controlling fluid inlets has an arcuate shape and is disposed about a center point of the imaging lens.

8. The immersion lithography apparatus of claim 7, wherein the plurality of direction-controlling fluid inlets are arranged in a plurality of concentric rings about the center point of the imaging lens.

9. An immersion lithography apparatus comprising:
a lens assembly having an imaging lens disposed therein;
a wafer stage configured to retain a wafer beneath the lens assembly; and
a double-nozzle direction-controlling fluid inlet disposed adjacent to the lens assembly, the direction-controlling fluid inlet including:
a main nozzle configured to direct a first flow of fluid beneath the lens assembly in a first direction, the main nozzle having a main passage through which the first flow of fluid passes; and
a secondary nozzle configured to direct a second flow of fluid in a second direction opposite of the first direction, the secondary nozzle having a secondary passage that intersects and is in fluid communication with the main passage, the second flow of fluid passing through the secondary passage.

10. The immersion lithography apparatus of claim 9, further including a pair of parallel direction-controlling fluid inlets disposed in a manner perpendicular to the double-nozzle direction-controlling fluid inlet, the lens assembly being interposed between the pair of parallel direction-controlling fluid inlets.

11. The immersion lithography apparatus of claim 10, wherein each direction-controlling fluid inlet in the pair of parallel direction-controlling fluid inlets is configured to direct fluid in a direction away from the lens assembly.

12. The immersion lithography apparatus of claim 9, further including a fluid tank configured to retain immersion fluid, the fluid tank situated with respect to the wafer stage for enabling full immersion of the wafer retained on the wafer stage in the immersion fluid; and
wherein fluid from the double-nozzle direction-controlling fluid inlet flows into the fluid tank.

13. The immersion lithography apparatus of claim 12, further including a cover disposed over at least a portion of the fluid tank for providing a temperature-controlled, non-evaporating environment within the fluid tank; and
wherein the double-nozzle direction-controlling fluid inlet extends through the cover.

14. The immersion lithography apparatus of claim 9, wherein the secondary passage is of a smaller diameter than the main passage.

15. An immersion exposure method, comprising:
loading a wafer onto a wafer stage disposed beneath a lens assembly having an imaging lens disposed therein;
filling the area between the lens and the wafer with an immersion fluid; and
selectively directing a flow of immersion fluid beneath the lens assembly with a plurality of direction-controlling fluid inlets disposed adjacent to the lens assembly, each direction-controlling fluid inlet in the plurality of direction-controlling fluid inlets being configured to direct fluid beneath the lens assembly and being independently controllable with respect to the other fluid inlets in the plurality of direction-controlling fluid inlets;
wherein the selectively directing is performed by a fluid control valve operable to independently open and close each direction-controlling fluid inlet in the plurality of direction-controlling fluid inlets; and
wherein the selectively directing includes the fluid control valve independently adjusting a first non-zero flow rate for a first direction-controlling fluid inlet and a second non-zero flow rate for a second direction-controlling fluid inlet perpendicular to the first fluid inlet, the first non-zero flow rate being different than the second non-zero flow rate to produce a flow of fluid with an arbitrary oblique flow direction.

16. The immersion exposure method of claim 15, wherein the selectively directing includes the fluid control valve opening one of the plurality of direction-controlling fluid inlets that is opposite an edge of the wafer that is closest to the imaging lens and closing a remainder of the plurality of direction-controlling fluid inlets.

17. The immersion exposure method of claim 15, wherein filling the area between the lens and the wafer includes filling a fluid tank in which the wafer stage is disposed with the immersion fluid such that the wafer is completely immersed within the immersion fluid.

* * * * *